United States Patent [19]
Sobhani et al.

[11] Patent Number: 5,481,134
[45] Date of Patent: Jan. 2, 1996

[54] STACKED HIGH DENSITY INTERCONNECTED INTEGRATED CIRCUIT SYSTEM

[75] Inventors: Mohi Sobhani, Encino; John M. Brauninger, Los Angeles, both of Calif.

[73] Assignee: Hughes Aircraft Company, Los Angeles, Calif.

[21] Appl. No.: 237,701

[22] Filed: May 3, 1994

[51] Int. Cl.$^6$ ................................................. H01L 23/02
[52] U.S. Cl. .......................... 257/686; 257/685; 257/723
[58] Field of Search ................................... 257/772, 779, 257/780, 781, 766, 685, 686

[56] References Cited

U.S. PATENT DOCUMENTS

| | | | |
|---|---|---|---|
| 4,862,249 | 8/1989 | Carlson | 257/686 |
| 4,894,706 | 1/1990 | Sato et al. | 257/686 |
| 4,953,005 | 8/1990 | Carlson et al. | 257/686 |
| 5,281,852 | 1/1994 | Normington | 257/723 |

*Primary Examiner*—Sara W. Crane
*Assistant Examiner*—S. V. Clark
*Attorney, Agent, or Firm*—M. E. Lachman; M. W. Sales; W. K. Denson-Low

[57] ABSTRACT

A three dimensional stacked integrated circuit system. The system includes a motherboard, a plurality of stacked integrated circuit subassemblies, and a plurality of Z-flex circuits coupled therebetween. The plurality of stacked integrated circuit subassemblies each comprise a base, an integrated circuit, and an X-Y flexprint circuit folded around the edges of the base that provides conducting paths thereto. The base comprises a heat conducting material, such as aluminum, aluminum nitride, alumina, beryllium oxide, or copper, for example. The X-Y flexprint circuits comprise printed interconnects that provide conducting paths between the motherboard and the integrated circuit subassemblies. The Z-flex printed circuits comprise a plurality of bumps that mate with a plurality of rings of the X-Y flexprint circuits, and a plurality of wrinkles that accommodate tolerance build up between the integrated circuit subassemblies. The Z-flex printed circuits may be single layer or multilayer flex circuits, or may comprise a lateral Z-flex printed circuit. The present invention thus interconnects several integrated circuits together to provide for a very high density, low weight, repairable microelectronic integrated circuit package. The system utilizes flexprint, bump, ring, and wire bonding (beam lead or tab) technologies that have been proven and tested for commercial and military applications. The system provides for a high density integrated circuit package that implements a thermal management scheme to maximize heat transfer away from the integrated circuits.

16 Claims, 3 Drawing Sheets

STACKED HIGH DENSITY INTERCONNECTED INTEGRATED CIRCUIT SYSTEM

BACKGROUND OF THE INVENTION

1. Field of the Invention

The present invention relates generally to integrated circuit systems, and more particularly to a three dimensional stacked high density interconnected integrated circuit system that provides for parallel processing capability.

2. Description of Related Art

Various conventional three dimensional packaging schemes have been developed by many integrated circuit systems developers. Each conventional three dimensional packaging scheme has problems, such as complexity, no repair capability, or the use of high cost exotic materials and technology.

More particularly, the disadvantages of the conventional three dimensional packaging schemes include utilization of complex ceramic, metalization, and solder technologies. The conventional three dimensional packaging schemes are difficult to disassemble in order to repair nonfunctional components. Most conventional three dimensional packaging schemes are expensive and complex assemblies. The conventional three dimensional packaging schemes are also difficult to test.

Therefore, it is an objective of the present invention to provide a three dimensional stacked high density interconnected integrated circuit system that provides for parallel processing capability and that may easily be tested, and/or repaired if necessary, and that is a relatively simple structure that uses low cost readily available materials and technologies.

SUMMARY OF THE INVENTION

In order to meet the above and other objectives, the present invention provides for a three dimensional stacked high density interconnected integrated circuit system. The three dimensional stacked high density interconnected integrated circuit system comprises a motherboard, a plurality of stacked integrated circuit subassemblies secured to the motherboard, and a plurality of Z-flex circuits secured to the plurality of stacked integrated circuit subassemblies and the motherboard. The plurality of stacked integrated circuit subassemblies each comprise a base, an integrated circuit disposed on the base, and an X-Y flexprint circuit comprising printed interconnects coupled to the integrated circuit that provide conducting paths thereto. The flexprint circuit is folded around the edges of the base. The base comprises a heat conducting material, such as aluminum, aluminum nitride, alumina, beryllium oxide, or copper, for example. The X-Y flexprint circuits comprise printed interconnects that provide conducting paths between the motherboard and the respective plurality of stacked integrated circuit subassemblies. The Z-flex printed circuits comprise a plurality of bumps that mate with a plurality of rings on each of the X-Y flexprint circuits of the respective integrated circuit subassemblies. The Z-flex printed circuits may comprise single layer or multilayer flex circuits, or may comprise a lateral Z-flex printed circuit or a combination thereof. The Z-flex printed circuits also comprise a plurality of wrinkles that accommodate tolerance build up between the integrated circuit subassemblies.

A plurality of vertical rods and a plurality of nuts located at the ends of the respective rods and between the motherboard and the plurality of stacked interconnected integrated circuit subassemblies secure the subassemblies to the motherboard. The plurality of Z-flex circuits may be secured to the plurality of stacked integrated circuit subassemblies by a plurality of pressure plates and screws. The pressure plates may include vias to provide for test point access to nodes of the integrated circuit. A cover plate may be disposed on top of the plurality of stacked integrated circuit subassemblies to secure them to the motherboard.

The present invention thus interconnects several integrated circuits together to provide for a very high density, low weight, repairable microelectronic integrated circuit package. The present invention utilizes flexprint, bump, ring and wire bonding (beam lead or tab) technologies that have been proven and tested for commercial and military applications.

The advantages of the present invention are that it provides for a high density integrated circuit system. The integrated circuit system implements an effective thermal management scheme to maximize heat transfer away from the integrated circuits. The present system has a low manufacturing cost and uses existing and proven fabrication technologies. No solder or epoxy is used for chip-to-chip electrical interconnections. The flex circuit used for chip-to-chip interconnection in the present invention may be a multilayer circuit incorporating controlled impedance signal paths, electrical shielding and thermal shunts. Every electrical node in a complete integrated circuit stack is accessible for testing.

The three dimensional stacked high density interconnected integrated circuit system of the present invention is suited for use in commercial applications such as pocket and laptop computers, super computers, and personal communications equipment, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4b illustrates a partial cross sectional side view of the integrated circuit subassembly of FIG. 4a;

FIG. 5b illustrates a side view of the Z-flex printed circuit of FIG. 5a;

FIG. 6b illustrates a top view of the system of FIG. 6a.

DESCRIPTION OF THE PREFERRED EMBODIMENTS

Figure 1:
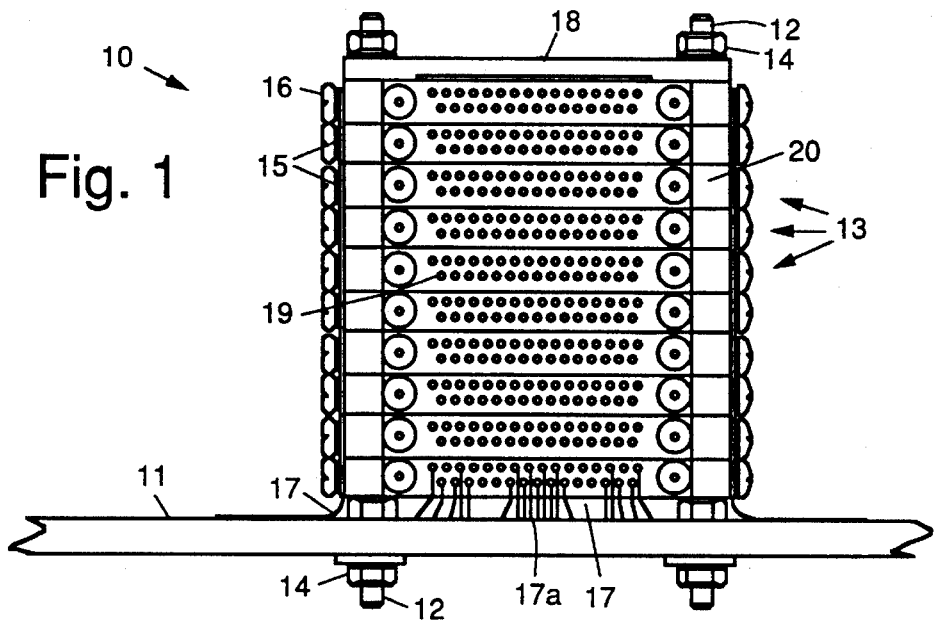
FIG. 1 illustrates a side view of a three dimensional stacked high density interconnected integrated circuit system in accordance with the principles of the present invention.

Referring to the drawing figures, FIG. 1 illustrates a side view of a three dimensional stacked high density interconnected integrated circuit system 10 in accordance with the principles of the present invention. The three dimensional stacked high density interconnected integrated circuit system 10 comprises a motherboard 11, a plurality of vertical rods 12 coupled to the motherboard 11 that are used to secure a plurality of stacked interconnected integrated circuit subassemblies 13 thereto. The plurality of stacked interconnected integrated circuit subassemblies 13 are secured to the motherboard 11 using a plurality of nuts 14 located at the ends of the respective rods 12 and between the motherboard 11 and the plurality of stacked interconnected integrated circuit subassemblies 13. Each integrated circuit subassembly 13 includes a base 20, an integrated circuit 50 (FIG. 4a), and a folded, preformed X-Y flexprint circuit 40 (FIGS. 3a–3c) interconnected to the integrated circuit 50.

The plurality of folded, preformed X-Y flexprint circuits 40 are folded around the edges of the respective integrated circuit subassemblies 13. A plurality of pressure plates 15 and screws 16 are used to secure and interconnect a plurality of Z-flex circuits 17 (FIGS. 5a–5c) to the plurality of folded, preformed X-Y flexprint circuits 40. The plurality of Z-flex circuits 17 have printed interconnects 17a printed thereon that provide conducting paths between the motherboard and the respective plurality of stacked interconnected integrated circuit subassemblies 13. The plurality of Z-flex circuits 17 thus interconnect the plurality of stacked interconnected integrated circuit subassemblies 13 to the motherboard 11. A cover plate 18 is disposed on top of the plurality of stacked interconnected integrated circuit subassemblies 13 and pressure is applied thereto by the plurality of nuts 14 to secure the plurality of stacked interconnected integrated circuit subassemblies 13 together. The pressure plates 15 may include vias 19 to provide for test point access to nodes of the integrated circuit 50.

Figure 2:
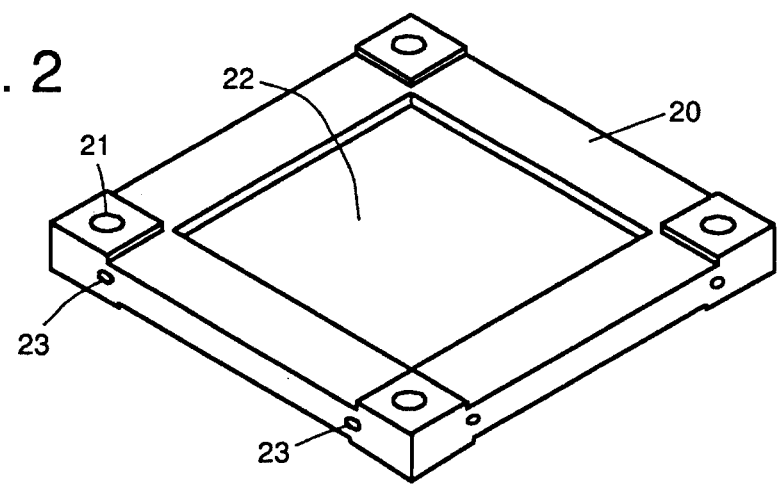
FIG. 2 illustrates a base employed in the system of FIG. 1.

The details of the three dimensional stacked high density interconnected integrated circuit system 10 will be described with reference to FIGS. 2–6. FIG. 2 illustrates the base 20 employed in the system 10 of FIG. 1. The base 20 is generally square or rectangular in shape, although any shape may be employed. A plurality of holes 21 are provided that have a size that is compatible with the rods 12. Recesses are provided on/in each surface that lightens the base 20 and provides areas 22 in which an integrated circuit 30 is secured. A plurality of threaded holes 23 are disposed along the sides of the base 20 that receive the screws 15 that hold the pressure plates 16 in place. Areas of the base 20 adjacent the holes 21 are raised relative to the remainder of the base 20 to provide channels through which the folded, preformed X-Y flexprint circuits 40 can pass.

The base 20 is made of a heat conducting material, such as aluminum, aluminum nitride, alumina, beryllium oxide, or copper, for example. The particular material from which the base 20 is made is selected to match the thermal load of the integrated circuit 50 (FIG. 4a) that is disposed thereon, and is fabricated having a shape as shown in FIG. 2. The function of the base 20 is two-fold. The base 20 holds the integrated circuit 50 for interconnection and transfers heat from the integrated circuit 50 to a cold plate (not shown) or other heat dissipation element.

Figure 3A:
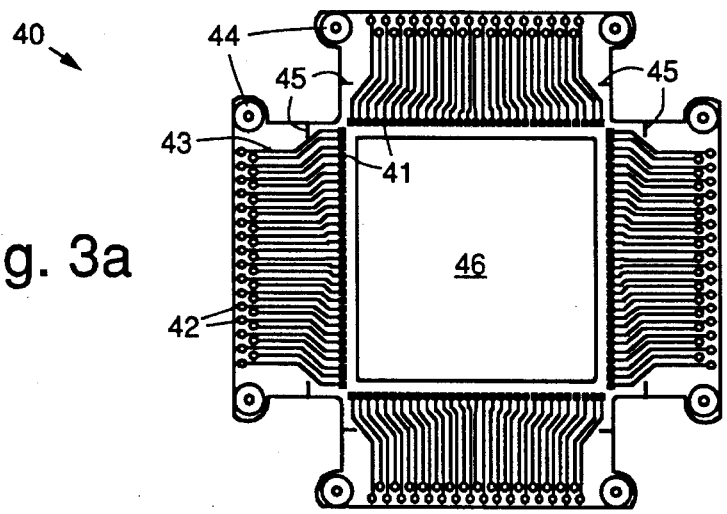
FIG. 3a illustrates a top view of an X-Y flexprint circuit employed in the system of FIG. 1.

FIG. 3a illustrates a top view of the X-Y flexprint circuit 40 employed in the system 10 of FIG. 1. The X-Y flexprint circuit 40 has the shape of a cross having an opening 46 in its middle. The X-Y flexprint circuit 40 has bonding pads 41 that are soft gold plated for wire bonding, and rings 42 that provide for interconnection testing and for interconnection to and from the other integrated circuit subassemblies 13 and to the motherboard 11. A plurality of interconnect lines 43 or wire bonds 43 (printed interconnects 43) interconnect the bonding pads 4 1 and the rings 42. A plurality of holes 44 are provided that permit passage of the screws 16 therethrough to secure the flexprint circuit 40 to the base and to the overlying Z-flex circuit 17. A plurality of fold lines 45 are provided that permit folding of the X-Y flexprint circuit 40 as shown in FIGS. 3a and 3b.

Figure 3B:
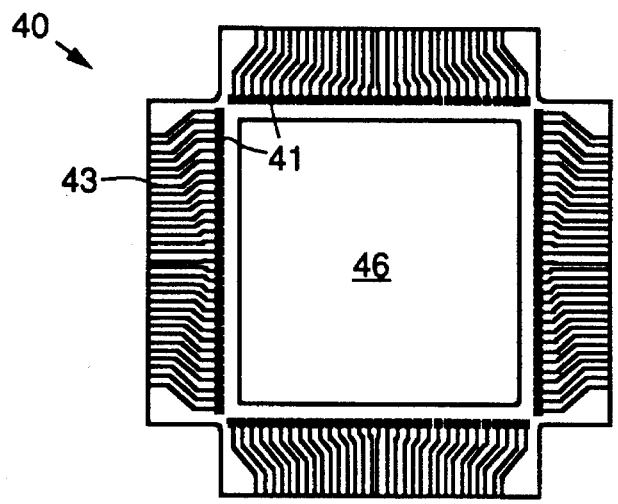
FIG. 3b illustrates a top view of the X-Y flexprint circuit of FIG. 3a in a folded, preformed condition.
Figure 3C:
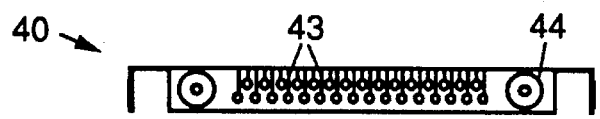
FIG. 3c illustrates a side view of the folded, preformed X-Y flexprint circuit of FIG. 3b.

FIG. 3b illustrates a top view of the X-Y flexprint circuit 40 of FIG. 3a in a folded, preformed condition. The X-Y flexprint circuit 40 is attached to the base 20 with bonding material, such as adhesive, or epoxy, for example. FIG. 3e illustrates a side view of the folded, preformed X-Y flexprint circuit 40 of FIG. 3b.

The X-Y flexprint circuit 40 used to interconnect integrated circuits 50 in the present invention may be a multilayer circuit incorporating controlled impedance signal paths, electrical shielding and thermal shunts. Fabrication details of the X-Y flexprint circuit 40 are well known and will not be discussed herein.

Figure 4A:
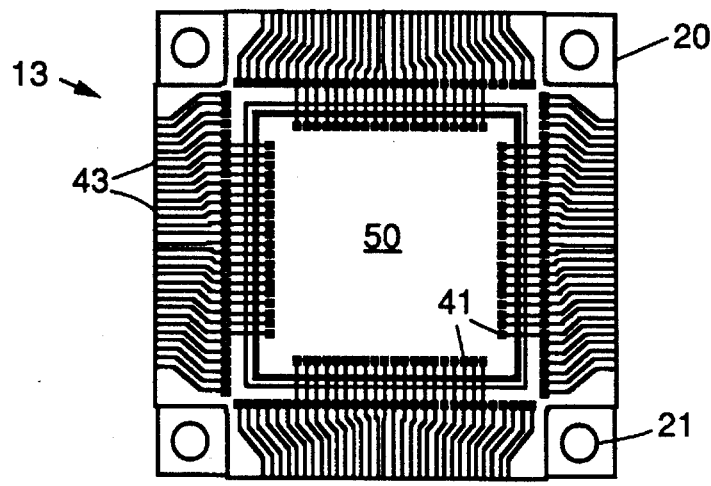
FIG. 4a illustrates a top view of an integrated circuit subassembly employed in the system of FIG. 1.
Figure 4B:
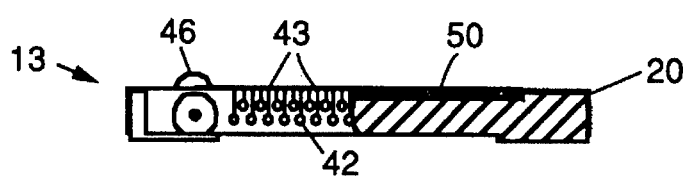

FIG. 4a illustrates a top view of the integrated circuit subassembly 13 employed in the system 10 of FIG. 1. The integrated circuit 50 may be coupled by wire bonds 43 to the bonding pads 41 on the X-Y flexprint circuit 40. For high production, tab or beam leads may be used instead of wire bonds 43. The integrated circuit 50 is disposed on and secured to the base 20 with silver epoxy or eutectic bonding material, for example. FIG. 4b illustrates a partial cross sectional side view of the integrated circuit subassembly 13 shown in FIG. 4a. The single integrated circuit subassembly 13 may be independently tested prior to stacking.

Figure 5A:
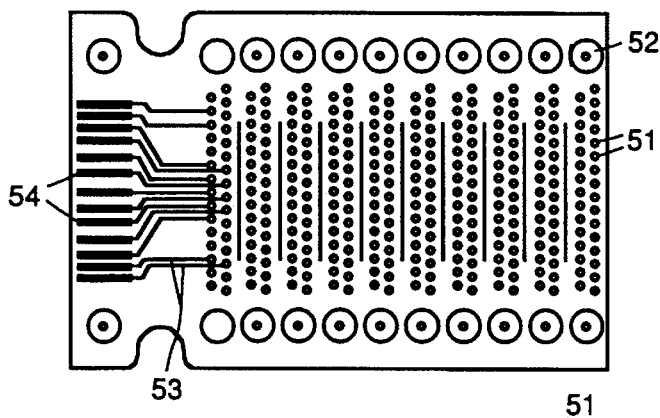
FIG. 5a illustrates a top view of a Z-flex printed circuit employed in the system of FIG. 1.
Figure 5B:

FIG. 5a illustrates a top view of the Z-flex printed circuit 17 employed in the system 10 of FIG. 1, while FIG. 5b illustrates a side view of the Z-flex printed circuit 17. The Z-flex printed circuit 17 is a rectangular flex circuit that comprises a plurality of bumps 51 that are configured to mate with the plurality of rings 42 on each of the folded X-Y flexprint circuits 40 of the respective integrated circuit subassemblies 13. The Z-flex printed circuit 17 has a plurality of holes through which the screws 16 are disposed to press the bumps 51 of the Z-flex printed circuit 17 onto the rings 42 of the folded X-Y flexprint circuits 40. The plurality of pressure plates 15 and screws 16 secure the plurality of Z-flex circuits 17 to the plurality of folded, preformed X-Y flexprint circuits 40. The Z-flex printed circuit 17 is a multilayer flex circuit whose bumps are connected by way of printed leads 53 (some of which are shown) to a plurality of bonding strips 54. The bonding strips 54 permit interconnection of the plurality of integrated circuits 50 to the motherboard 11 and permits testing of the stack of integrated circuit subassemblies 13. As shown in FIG. 5b, the Z-flex printed circuit 17 has a plurality of wrinkles 55 formed therein. The wrinkles permit relative movement of the respective sets of bumps 51 when they are pressed by the pressure plate 15 so that contact may be made between the Z-flex printed circuit 17 and each of the folded X-Y flexprint circuits 40. The wrinkles 55 accommodate tolerance build up between the integrated circuit subassemblies 13.

Figure 6A:
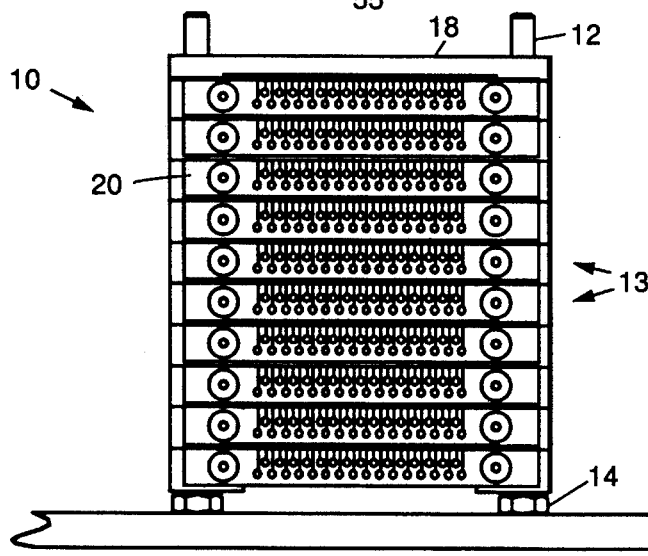
FIG. 6a illustrates a side view of an assembled but non-interconnected system in accordance with the principles of the present invention.
Figure 6B:
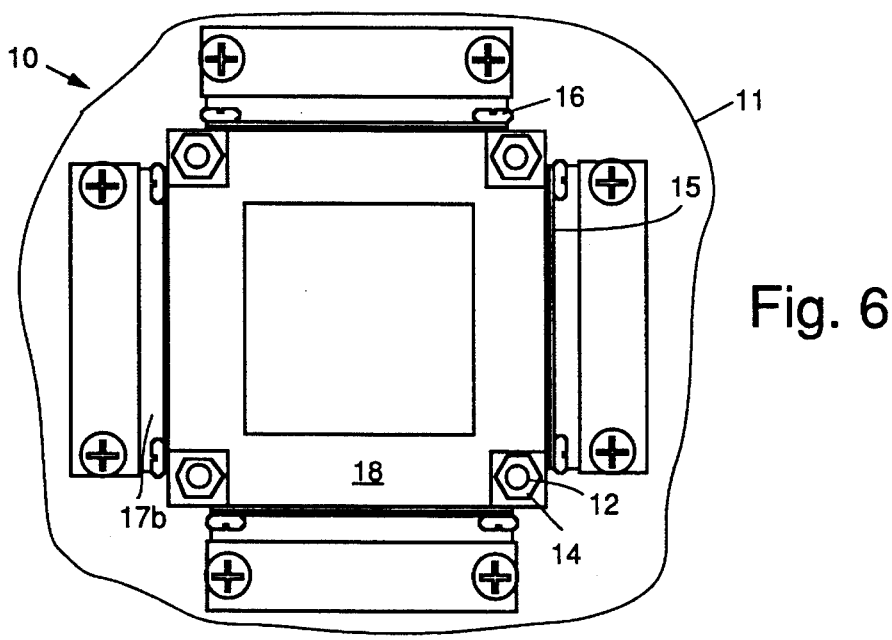

FIG. 6a illustrates a side view of an assembled but non-interconnected system 10 in accordance with the principles of the present invention, while FIG. 6b illustrates a top view of the system 10 of FIG. 6a. Several integrated circuit subassemblies 13 are stacked to build the system 10 as is shown in FIG. 6a. The Z-flex printed circuits 17 are secured to each side of the stack of integrated circuit subassemblies 13. The pressure plates 15 are used to interconnect the bumps 51 on the Z-flex printed circuits 17 to the rings 42 on the X-Y flexprint circuits 40 of each integrated circuit subassemblies 13 using the screws 16. Test point access to nodes of the integrated circuit 50 are provided by the vias 19 through the pressure plates 15. In addition, FIG. 6b illustrates alternative interconnection of the stack of integrated circuit subassemblies 13. In particular, a lateral Z-flex printed circuit 17b may be configured to wrap around the periphery of the stack of integrated circuit subassemblies 13. Thus lateral interconnection of the integrated circuit 50 is achieved in addition to or in lieu of the vertical Z-flex printed circuit 17.

To complete fabrication of the system 10 four Z-flex printed circuits 17, which may be either single layer or multilayer, with or without shielding and having bumps 51 as shown in FIGS. 5a and 5b are used to interconnect the plurality of integrated circuit subassemblies 13. These Z-flex printed circuits 17 are used to interconnect the plurality of integrated circuit subassemblies 13 together in a vertical (Z) direction. The small wrinkles 55 in the Z-flex printed circuits 17 are used to accommodate tolerance build up between individual ones of the integrated circuit subassemblies 13. After the integrated circuit subassemblies 13 are stacked and interconnected using the Z-flex printed circuits 17 this assembly is placed on the motherboard 11. The end of Z-flex printed circuits 17 are then either soldered or bump/ring interconnected to the motherboard 11.

Several stacks of interconnected integrated circuit subassemblies 13 may be disposed on a motherboard 11 that may be used to provide for a multi-module stacked system 10. Furthermore, heat sinks (not shown) may be incorporated on the sides of the stacks of integrated circuit subassemblies 13, between the integrated circuit subassemblies 13 (stack layers), or on the top and bottom of a stack of integrated circuit subassemblies 13.

At any time during prototype, production, or in the field, the stack(s) of integrated circuit subassemblies 13 may be removed from the motherboard 11 for repair, or may be replaced or upgraded, for example. Also individual ones of the integrated circuit subassemblies 13 may be replaced or repaired by disconnecting the mated bumps 51 and rings 42 on the X-Y flexprint circuit 40 and Z-flex printed circuits 17.

Thus, the present invention interconnects several integrated circuits 50 together to provide for a very high density, low weight, repairable microelectronic integrated circuit system 10. The present invention utilizes proven interconnection technologies that are reliable and provide for high volume production. The system 10 implements an effective thermal management scheme using the bases 20 and the cover plate 18 to maximize heat transfer away from the integrated circuits. The system 10 has a relatively low manufacturing cost and uses existing and proven fabrication technologies. Every electrical node in a stack of integrated circuits 50 is accessible for testing. The system 10 may be used in applications such as pocket and laptop computers, super computers, and personal communications equipment, and the like.

Thus there has been described a new and improved three dimensional stacked high density interconnected integrated circuit system that provides for parallel processing capability. It is to be understood that the above-described embodiment is merely illustrative of some of the many specific embodiments which represent applications of the principles of the present invention. Clearly, numerous and other arrangements can be readily devised by those skilled in the an without departing from the scope of the invention.

What is claimed is:

1. A three dimensional stacked high density interconnected integrated circuit system comprising;
   (a) a motherboard;
   (b) a plurality of stacked integrated circuit subassemblies secured to the motherboard that each comprise:
      (1) a base;
      (2) an integrated circuit disposed on the base; and
      (3) an X-Y flexprint circuit comprising printed interconnects coupled to the integrated circuit and terminating in a plurality of rings to thereby provide conducting paths to said integrated circuit, wherein the flexprint circuit is folded around the edges of the base such that said rings are exposed at said edges of said base;
   (c) a plurality of Z-flex circuits secured to the plurality of stacked integrated circuit subassemblies and the motherboard wherein said Z-flex circuits comprise printed leads that terminate in a plurality of bumps to thereby provide conducting paths between the motherboard and the respective plurality of stacked integrated circuit subassemblies when said bumps on said Z-flex circuit are brought into contact with said rings on said X-Y flexprint circuit;
   (d) a plurality of vertical rods and a plurality of nuts located at the ends of the respective rods and between the motherboard and the plurality of stacked interconnected integrated circuit subassemblies that secure the plurality of stacked integrated circuit subassemblies to the motherboard; and
   (e) a plurality of pressure plates and screws that secure the Z-flex circuit to the plurality of stacked integrated circuit subassemblies.

2. The system of claim 1 wherein the pressure plates include vias to provide for test point access to nodes of the integrated circuit.

3. The system of claim 1 further comprising a cover plate disposed on top of the plurality of stacked integrated circuit subassemblies that is secured by the plurality of nuts.

4. The system of claim 1 wherein the base is comprised of a heat conducting material.

5. The system of claim 4 wherein the heat conducting material is comprised of aluminum.

6. The system of claim 4 wherein the heat conducting material is comprised of aluminum nitride.

7. The system of claim 4 wherein the heat conducting material is comprised of alumina.

8. The system of claim 4 wherein the heat conducting material is comprised of beryllium oxide.

9. The system of claim 4 wherein the heat conducting material is comprised of copper.

10. The system of claim 1 wherein the X-Y flexprint circuit has a cross shape having an opening disposed therein.

11. The system of claim 1 wherein the X-Y flexprint circuit is attached to the base with bonding material.

12. The system of claim 1 wherein the bonding material comprises adhesive.

13. The system of claim 1 wherein the bonding material comprises epoxy.

14. The system of claim 1 wherein the Z-flex printed circuit comprises a multilayer flex circuit.

15. The system of claim 1 wherein the Z-flex printed circuit comprises a plurality of wrinkles that accommodate tolerance build up between the integrated circuit subassemblies.

16. The system of claim 1 wherein the Z-flex printed circuit comprises a lateral Z-flex printed circuit that provides conducting paths between the plurality of stacked integrated circuit subassemblies.

* * * * *